(12) United States Patent
Grover et al.

(10) Patent No.: US 6,790,680 B1
(45) Date of Patent: Sep. 14, 2004

(54) DETERMINING A POSSIBLE CAUSE OF A FAULT IN A SEMICONDUCTOR FABRICATION PROCESS

(75) Inventors: Jason A. Grover, Austin, TX (US);
Elfido Coss, Jr., Austin, TX (US);
Michael R. Conboy, Austin, TX (US);
Sam H. Allen, Jr., New Braunfels, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 301 days.

(21) Appl. No.: 10/052,055

(22) Filed: Jan. 17, 2002

(51) Int. Cl.$^7$ .......................... H01L 21/00; G06F 19/00
(52) U.S. Cl. ............................................ 438/5; 700/121
(58) Field of Search ........................ 438/5–16; 700/121

*Primary Examiner*—Evan Pert
(74) *Attorney, Agent, or Firm*—Williams, Morgan & Amerson, P.C.

(57) ABSTRACT

A method and apparatus for determining a possible cause of a fault in a semiconductor fabrication process. The method includes determining a first fault in a first processing tool executing under first operating conditions and determining a second fault in a second processing tool executing under second operating conditions. The method further includes identifying a possible source of the second fault based on at least the first operating conditions of the first processing tool.

37 Claims, 6 Drawing Sheets

DETERMINING A POSSIBLE CAUSE OF A FAULT IN A SEMICONDUCTOR FABRICATION PROCESS

BACKGROUND OF THE INVENTION

1. Field of the Invention

This invention relates generally to a semiconductor fabrication process, and, more particularly, to determining a possible cause of a fault in a semiconductor fabrication process.

2. Description of the Related Art

There is a constant drive in the semiconductor industry to increase the quality, reliability, and throughput of integrated circuit devices such as microprocessors, memory devices and the like. This drive is fueled by consumer demands for higher quality computers and electronic devices that operate more reliably.

These demands by the consumer have resulted in some improvements in the manufacture of semiconductor devices as well as in the manufacture of integrated circuit devices incorporating such semiconductor devices. Reducing the defects in the manufacture of these devices lowers the cost of the devices themselves. Accordingly, the cost of the final product incorporating these devices is also reduced, thus providing inherent monetary benefits to both the consumer and manufacturer.

Semiconductor manufacturing processes have become more reliable and robust over the past few years. Semiconductor manufacturing processes of today may include an intricate collection of multiple processing tools for manufacturing semiconductor devices. While the benefits of linking multiple processing tools are inherently obvious, there can, however, be some drawbacks, particularly from the standpoint of troubleshooting problems or faults. That is, determining the source of a fault that occurs during the semiconductor manufacturing process may prove to be challenging, as the fault may have occurred in any one of the several processing tools that operate on the semiconductor device along the way. Failing to identify the source of the problem expeditiously may naturally delay any potential corrective measures that can be taken to address the problem. Because of this delay, the operation of the semiconductor manufacturing process may be adversely affected, thereby resulting in potential increase in costs for the manufacturer and consumer.

The present invention is directed to overcoming, or at least reducing the effects of, one or more of the problems set forth above.

SUMMARY OF THE INVENTION

In one embodiment of the present invention, a method is provided for determining a cause of a fault in a semiconductor fabrication process. The method includes determining a first fault in a first processing tool executing under first operating conditions and determining a second fault in a second processing tool executing under second operating conditions. The method further includes identifying a possible source of the second fault based on at least the first operating conditions of the first processing tool.

In another embodiment of the present invention an apparatus is provided for determining a cause of a fault in a semiconductor fabrication process. The apparatus includes an interface and a control unit. The control unit is communicatively coupled to the interface. The control unit is further adapted to detect a first fault in a first processing tool, detect a second fault in a second processing tool, and determine a cause of the second fault based on detecting the first fault.

In a further embodiment of the present invention, an article comprising one or more machine-readable storage media containing instructions is provided for determining a possible cause of a fault in a semiconductor fabrication process. The one or more instructions, when executed, enable a processor to determine that a fault condition exists in a first processing tool, determine that a fault condition exists in a second processing tool, and determine if the fault condition in the second processing tool has a common cause as the fault condition in the first processing tool.

In yet another embodiment of the present invention, a system is provided for determining a possible cause of a fault in a semiconductor fabrication process. The system includes a first processing tool, a second processing tool, and a fault detection and analysis unit The first processing tool is adapted to process a semiconductor device. The second processing tool is adapted to process the semiconductor device. The fault detection and analysis unit is adapted to determine that a fault condition is present in the first and second processing tools, and determine if the first and second processing tools have at least one common configuration element in response to determining that the fault condition is present in the first and second processing tools.

In another embodiment of the present invention an apparatus is provided for determining a cause of a fault in a semiconductor fabrication process. The apparatus includes an interface and a control unit. The control unit is communicatively coupled to the interface. The control unit is adapted to detect a fault in a first processing tool and determine that the detected fault is due to an error in delivering a resource supply to a second processing tool.

In another embodiment of the present invention an apparatus is provided for determining a cause of a fault in a semiconductor fabrication process. The apparatus includes an interface and a control unit. The control unit is communicatively coupled to the interface and is adapted to detect a fault in a first processing tool and determine that the detected fault is due to an error in delivering a resource supply to a second processing tool.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 1:
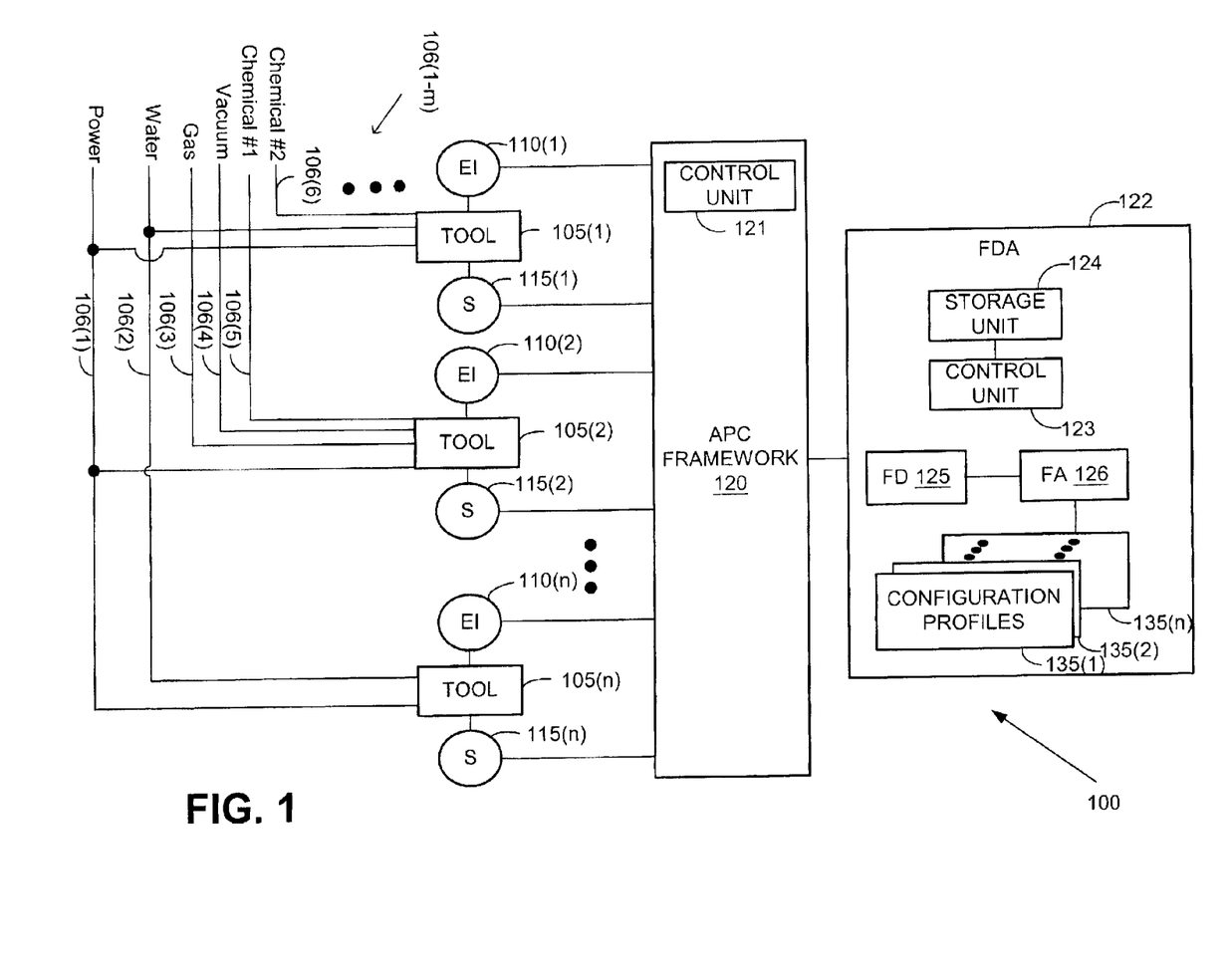
FIG. 1 illustrates a manufacturing system, including an APC framework, for determining a possible cause of a fault, in accordance with one embodiment of the present invention.

Turning now to the drawings, and specifically referring to FIG. 1, a block diagram of a system 100 for providing fault detection and analysis in a semiconductor fabrication process is illustrated. The system 100 includes a plurality of processing tools 105 (shown as tools 105(1-n) in FIG. 1). The processing tools 105 in the illustrated embodiment may be in the form of semiconductor fabrication equipment used to produce and process semiconductor material, such as silicon wafers, for example. It will be appreciated, however, that the processing tools 105 need not necessarily be limited to the production of silicon wafers, but could include other types of manufacturing equipment for producing a variety of different types of commercial products without departing from the spirit and scope of the present invention.

In one embodiment, the processing tools 105 may be downstream to each other (e.g., the second processing tool 105(2) may be downstream to the first processing tool 105(1), the third processing tool 105(3) may be downstream to the second processing tool 105(2), and so forth). As such, a semiconductor device that is processed by the first processing tool 105(1) may, for example, be provided to the second processing tool 105(2), which may further process the semiconductor device before it is processed by the next processing tool 105(3). This process may continue until the last processing tool 105(n) has completed processing the semiconductor device. In an alternative embodiment, one or more of the processing acts performed by a single, multi-chambered processing tool 105. However, such a multi-chambered tool 105 is considered, at least for the purposes of this discussion, to be merely a conglomeration of a plurality of individual processing tools 105, and thus deemed to be within the scope of one or more embodiments of the present invention.

The processing tools 105 of the system 100, in the one embodiment, may perform various processing steps to create a packaged semiconductor device. For example, the processing tools 105 may be used for manufacturing the raw semiconductor material, slicing the semiconductor crystal ingot into individual wafers, fabricating (e.g., etching, doping, ion implanting) the wafers, testing and packaging the completed semiconductor devices. The number of processing tools 105 employed in the system 100 may be implementation specific, and thus may vary from one embodiment to another depending on the particular processing steps desired.

To perform one or more of the above-mentioned processing steps, the processing tools 105 may require a selected supply of resources, such as water, electrical power, gas or air, chemicals, vacuum, and the like, from various facilities 106 (shown as facilities 106(1-m) in FIG. 1). In the illustrated embodiment of FIG. 1, for example, the first processing tool 105(1) includes a connection to the electrical power facility 106(1), water facility 106(2), and chemical facility 106(6). Similarly, in the illustrated example, the second processing tool 105(2) is connected to the electrical power facility 106(1), gas facility 106(3), vacuum facility 106(4), and chemical facility 106(5). The various connections of the processing tools 105 to the selected facilities 106 are shown for illustrative purposes only, and may vary from one implementation to another. Accordingly, fewer, additional, or different connections may be employed in alternative embodiments.

Several discrete processes may be involved in semiconductor manufacturing, and, as such, multiple manufacturing processing tools 105 may be utilized to process the semiconductor devices before arriving at the final product. During this manufacturing process, errors or faults may occur at a variety of points and for a variety of reasons. The term "fault," as utilized herein, refers to any undesirable condition occurring in one or more of the processing tools 105. One example of a fault may be an alarm that is generated by the processing tools 105 when unexpected or undesired events, such as an overheating chamber, load lock error, and the like, occur in that processing tool 105. Another example of a fault includes detecting a defective semiconductor device in the semiconductor manufacturing process, which, for example, may be a wafer that is manufactured outside the acceptable parameters or not within the prescribed operational parameters.

Faults can occur because of a malfunction in the processing tool 105 itself. As such, because of the malfunction in the processing tool 105, the processing tool 105 may produce one or more defective semiconductor devices or generate an alarm indicating an undesirable condition. However, faults can also occur for reasons that are substantially independent of the processing tool 105. That is, while the processing tool 105 may generate the fault, the actual source of the fault may be an event or act that is independent of the processing tool 105. For example, the processing tool 105 may generate a fault because of abnormal ambient conditions external to the processing tool 105, such as unusually high or low temperatures or humidity levels. Such undesirable ambient conditions may cause the processing tool 105 to produce defective semiconductor devices or otherwise cause the processing tool 105 to generate an alarm that signifies an undesirable condition. As an additional example, errors or glitches in the supply of resources (e.g., air, water, electrical power) to the processing tool 105 may also cause the processing tool 105 (or some other downstream processing tool 105) to generate faults. It should be noted that while in the above-mentioned examples it is the processing tool 105 that generates the fault, the actual procuring cause of the fault may be substantially independent of the processing tool 105. Embodiments of the present invention identify the possible causes of faults that are not necessarily processing tool-based.

In the illustrated embodiment, the processing tools 105 are coupled to respective equipment interfaces (EI) 110. Each equipment interfaces 110 retrieves various operational data from its respective processing tool 105, and communicates this data to an Advanced Process Control (APC)

framework 120 to determine whether the processing tool 105 is experiencing a faulty operation. Each equipment interface 110 may further receive control signals from the APC framework 120 that may be used to control the respective processing tool 105. For example, a control signal from the APC framework 120 may be used to shut down the first processing tool 105(1) if the operational data that was sent by the first equipment interface 110(1) was deemed faulty by the APC framework 120.

The APC framework 120 may be any one of a variety of arrangements that facilitates communications to and from the processing tools 105. In one embodiment, the APC framework 120 may include a control unit 121 that manages the communications to and from the APC framework 120. The control unit 121 may also control the overall operations of one or more of the processing tools 105.

In the illustrated embodiment, the processing tools 105 are coupled to respective sensors 115 (shown as sensors 115(1-$n$) in FIG. 1). The sensor 115 measures additional operational data that may not be ascertained by the associated processing tool 105 itself. For example, the sensor 115 may be used to determine a temperature range or other environmental or ambient data near or around the associated processing tool 105. In alternative embodiments, the sensor 115 may be used to sense various other operational parameters, and, thus, need not be limited to the aforementioned examples.

The sensor 115 may be embodied as a simple data acquisition program, such as a C++ standalone program acquiring data from a thermocouple wire, for example. Alternatively, the sensor 115 may be embodied as a full-fledged LABVIEW application, acquiring data through multiple transducers (not shown). It will further be appreciated that the sensor 115 need not be used at all, and the APC framework 120 may rely upon the operational data forwarded from the equipment interface 110. If used, in one embodiment, the sensor 115 forwards the additional operational data to the APC framework 120 for analysis.

The system 100 includes a fault detection and analysis (FDA) unit 122 having a control unit 123 and a storage unit 124. The fault detection and analysis unit 122, which in the illustrated embodiment includes a fault detection (FD) module 125 and a fault analysis (FA) module 126, detects one or more faults in the system 100 and, as explained in more detail below, determines the possible cause or source of the detected faults. The fault detection and analysis unit 122, fault detection module 125, and fault analysis module 126, in one embodiment, may be implemented in hardware, software, or a combination thereof The fault detection and analysis unit 122, which is coupled to the APC framework 120, receives the operational data of the processing tool 105 from the equipment interface 110 and sensor 115 via the APC framework 120. In one embodiment, the operational data provided to the fault detection and analysis unit 122 via the APC framework 120 may include a date and time stamp that may be utilized by the fault detection module 125 to determine at least an approximate (if not substantially the exact) time and date the fault occurred in the processing tool 105. Prior to sending the operational data to the fault detection and analysis unit 122, the APC framework 120 may, in one embodiment, translate the operational data to a format that is recognizable to the fault detection and analysis unit 122 in a manner that is well known to those of ordinary skill in the art. In an alternative embodiment, the fault detection and analysis unit 122 may be integrated into the APC framework 120, and, as such, the translation of the operational data to a format that is recognizable by the fault detection and analysis unit 122 may not be necessary.

In accordance with one embodiment, the fault detection module 125 includes a commercially available software package, such as ModelWare, for example, that provides fault detection analysis of the processing tools 105. It will be appreciated, however, that other types of commercially available fault detection software may also be used in lieu thereof without departing from the spirit and scope of the present invention.

The fault detection module 125 compares the received operational data from the APC framework 120 to fault model data. The fault model data includes operational data of other similar-type tools, where it was previously known that such tools have operated within acceptable operational limits. The types of faults that may be detected by the fault detection module 125 include processing and/or operational faults in silicon wafer fabrication. Examples of processing faults may include, but are not necessarily limited to, non-optimal preheating of the chamber, catastrophic failure where a broken wafer is detected, abnormal nitrogen (N2) flow rate, temperature overshoots at the top of a ramp, tube temperature measurement drifts, etc. Examples of operational faults detected by the fault detection module 125 may include interrupted/resumed processing, no wafer sleuth or improper wafer sleuth prior to Rapid Thermal Anneal (RTA), etc. As mentioned, the detected faults, whether they are processing or operation faults, may be caused by events that are substantially independent of the processing tool 105, events that may include, but are not limited to, an error in delivery of resource supplies to the processing tool 105 and undesirable ambient conditions external to the processing tool 105.

The fault detection module 125, upon evaluating the operational data sent from the APC framework 120, provides the results of potential faults and/or proper operation of the processing tools 105 to the fault analysis module 126. In accordance with one embodiment of the present invention, the fault analysis module 126 analyzes the received results to identify the possible source of the faults. As explained in more detail below, the fault analysis module 126, in one embodiment, identifies the possible source of the faults based on configuration profiles 135 of the processing tools 105. In one embodiment, at least one configuration profile 135 may be stored in the fault detection and analysis unit 122 for each corresponding processing tool 105.

Figure 2:
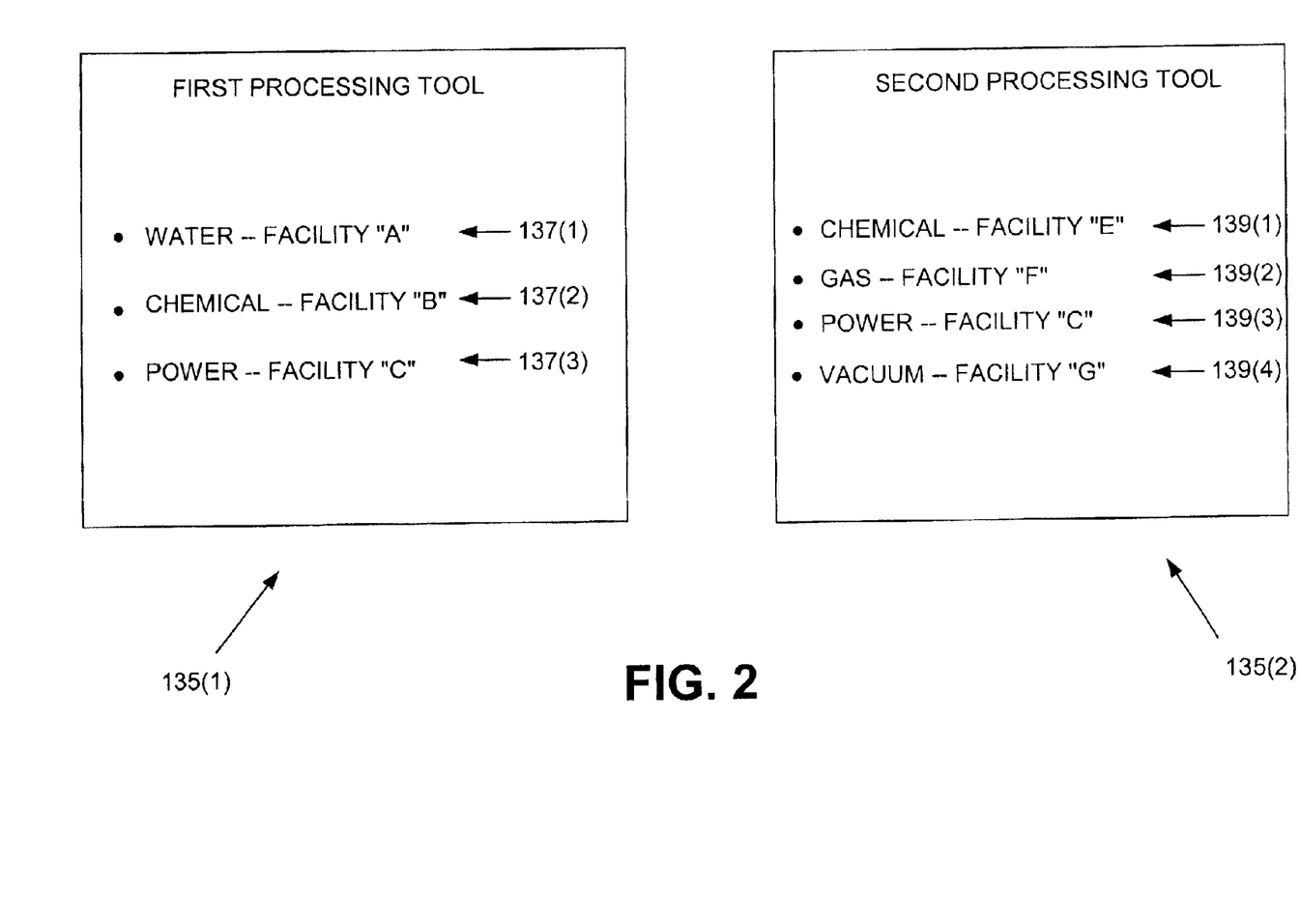
FIG. 2 depicts exemplary configuration profiles that may be utilized in the manufacturing system of FIG. 1.

The configuration profile 135 in the illustrated embodiment is storable in the storage unit 124 of the fault detection and analysis unit 122 and may include the configuration settings of the corresponding processing tool 105. For illustrative purposes, exemplary configuration profiles 135(1-2) for the first processing tool 105(1) and the second processing tool 105(2) are provided in FIG. 2. As shown in FIG. 2, the first configuration profile 135(1) includes a plurality of configuration elements (or settings) 137(1-3) for the first processing tool 105(1). In particular, the elements 137(1-3) of the first configuration profile 135(1) indicate that the first processing tool 105(1) receives water, chemical, and power from three facilities 106 marked, for illustrative purposes, as "A," "B," and "C," respectively. The second configuration profile 135(2) similarly includes a plurality of configuration elements 139(14) that indicate that the second processing tool 105(2) receives the desired chemical, gas, and power from four facilities 106 identified as "E," "F," "C," and "G," respectively. In the illustrated exemplary configuration profiles 135(1-2) of FIG. 2, the first and second processing tools 105(1-2) receive power from a common facility, facility "C," while the remaining resources are received from different facilities 106.

It should be appreciated that the configuration profiles 135(1–2) illustrated in FIG. 2 are illustrative only, and that additional or less configuration information may be included in the profiles 135(1–2), depending, for example, on the particular processing tool 105 employed. For instance, in one embodiment, the processing tool 105 may have only one configuration element (such as only power). Additionally, although the configuration profiles 135(1–2) may be stored in the storage unit 124 of the fault detection and analysis unit 122, in an alternative embodiment, the configuration information stored in the configuration profiles 135(1–2) may be provided by the respective processing tool 105(1–2) on a periodic basis or when requested by the fault detection and analysis unit 122.

The configuration of a particular processing tool 105, and the ambient conditions in which that processing tool 105 operates, are hereinafter referred to as the "operating conditions" of that processing tool 105. As such, information with respect to the "operating conditions" of the processing tool 105 may include one of more of the following: information relevant to the hardware/software components installed or configured in the processing tool 105, resource supplies (e.g., the type of resource, the delivery means of the resource, the source of the resource) provided to the processing tool 105, location of the processing tool 105, times during which the processing tool 105 is in operation, and ambient conditions, such as humidity, barometric, and temperature levels, for at least the areas proximate to the physical location of the processing tool 105.

Referring again to FIG. 1, based on the analysis of the fault analysis module 126, corrective action may be taken, if necessary, to resolve the detected fault. The corrective action desired may be provided by the fault detection and analysis unit 122 to the APC framework 120, which, in turn, may send control signals to the equipment interface 110 to control the processing tool 105 based upon the analysis forwarded from the fault analysis module 126. For example, the control signal from the APC framework 120 may be to shut down the processing tool 105 to prevent any additional faulty production of wafers (providing this was determined by the fault detection module 125). Data may also be sent from the APC framework 120 to inform a "fab" technician on how to rectify a faulty condition of the processing tool 105, if so desired.

It should be appreciated that the illustrated components shown in the block diagram of the system 100 in FIG. 2 are illustrative only, and that, in alternative embodiments, additional or fewer components may be utilized without deviating from the spirit or scope of the invention. For example, in one embodiment, the one or more of the processing tools 105 may not have an associated sensor 115. Additionally, it should be noted that although various components, such as the equipment interface 110 of the system 100 of FIG. 2 are shown as stand-alone components, in alternative embodiments, such components may be integrated into the processing tool 105. Similarly, the fault detection and analysis unit 122 maybe integrated into the APC framework 120.

Figure 3:
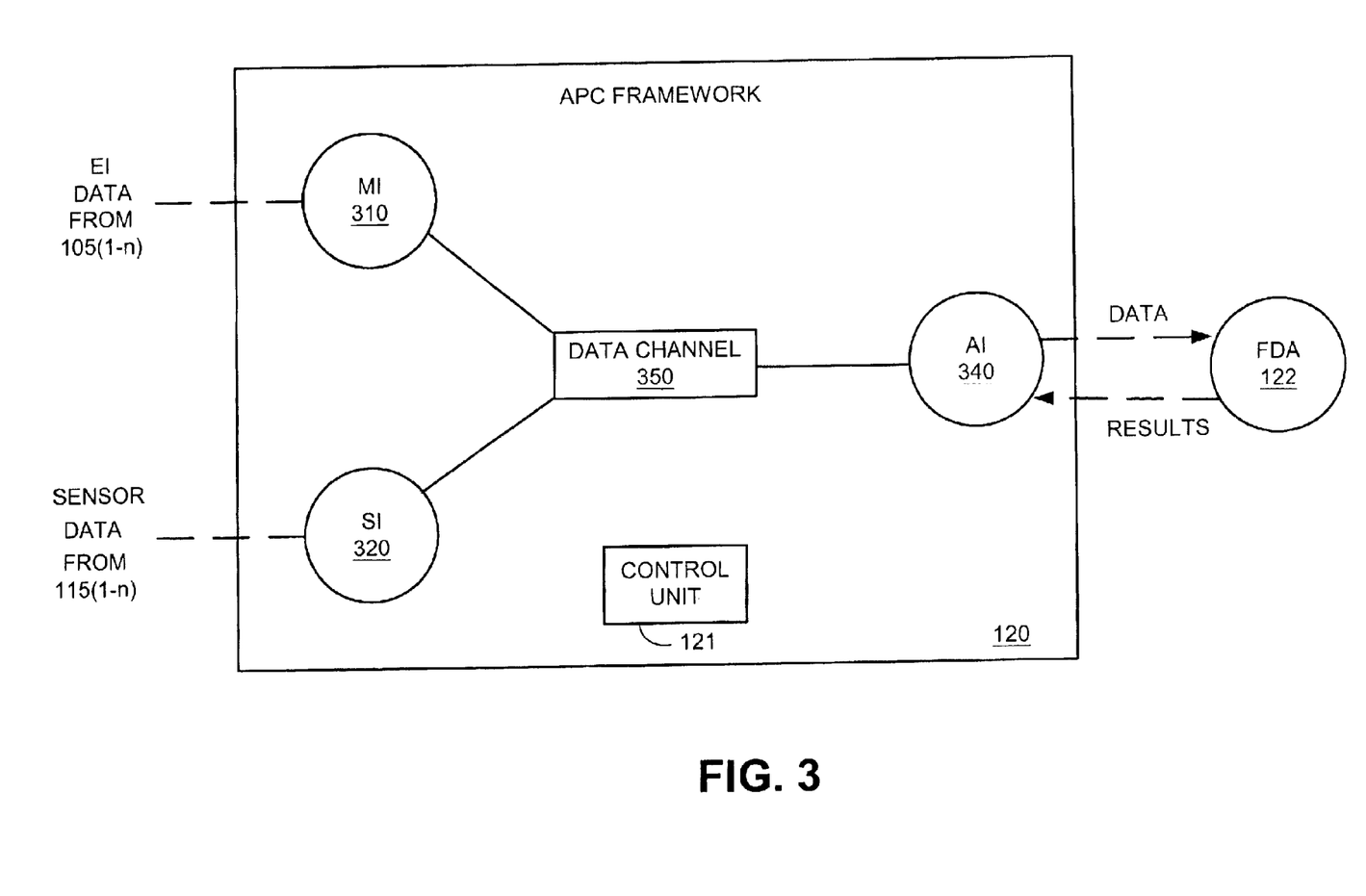
FIG. 3 illustrates the detail of the APC framework of FIG. 1, in accordance with one embodiment of the present invention.

Turning now to FIG. 3, a more detailed representation of the APC framework 120 is provided. The APC framework 120 is a component-based architecture comprised of interchangeable, standardized software components enabling run-to-run control and fault detection of the processing tool 105. The APC framework 120 includes a machine interface (MI) 310 for communication with the processing tool 105 and the APC framework 120 to collect operational data therefrom. The APC framework 120 further includes a sensor interface (SI) 320 for communication between the sensor 115 and the APC framework 120. The sensor interface 320 also collects operational data of the processing tool 105 through the sensor 115. The APC framework 120 further includes an applications interface (AI) 340 for interfacing with third-party applications that run on the fault detection module 125 to analyze the operational data received via the machine and sensor interfaces 310, 320. In the illustrated embodiment, the third-party application is the fault detection and analysis unit 122. A data channel 350 is further provided to allow for communication of data from the machine and sensor interfaces 310, 320 and the applications interface 340 of the APC framework 120.

The machine interface (MI) 310 couples to the equipment interface 110 to serve as an interface between the processing tool 105 and the APC framework 120. The machine interface 310 supports the setup, activation, monitoring, and data collection of the processing tool 105. The machine interface 310 receives commands, status events, and collected data from the equipment interface 110 and forwards this information to other components of the APC framework 120, namely the applications interface 340. Any responses that are received by the machine interface 310 from the other components of the APC framework 120 are routed to the equipment interface 110 for delivery to the processing tool 105. As previously discussed, this may include a control signal from the fault detection and analysis unit 122 (see FIG. 1) to manipulate the processing tool 105 if a faulty condition is detected.

The machine interface 310 may also reformat and restructure the messages between the specific communications protocol utilized by the equipment interface 110 and the Common Object Request Broker Architecture Interface Definition Language (CORBA IDL) communications protocol used by the components of the APC framework 120. The manner in which the machine interface 310 performs such translation between the equipment interface-specific communications protocol and the CORBA IDL protocol of the APC framework 120 is well known to those of ordinary skill in the art. Accordingly, the specific translation process between these two formats will not be discussed herein to avoid unnecessarily obscuring the present invention.

The sensor interface 320 is coupled to the sensor 115 and serves as an interface between the sensor 115 and the APC framework 120. The sensor interface 320 provides setup, activation, monitoring, and data collection for the sensor 115. Similar to the machine interface 310, the sensor interface 320 may also reformat and restructure the messages between the specific communications protocol utilized by the sensor 115 and the CORBA IDL protocol used by the components of the APC framework 120.

The applications interface 340 supports the integration of third-party tools (e.g., commercial software packages, such as ModelWare, MatLab, and Mathematica, for example) to the APC framework 120. Typically, these third-party tools do not provide the standard CORBA IDL protocol known to the APC framework 120; accordingly, the applications interface 340 provides the necessary translation between the communications protocol utilized by the third-party tool and the CORBA protocol used by the APC framework 120.

In the illustrated embodiment, the third-party tool may be the fault detection module 125 for analyzing the operational data of the processing tool 105 that is supplied via the machine interface 310 and the sensor interface 320. In one embodiment, the fault detection module 125 includes ModelWare software for providing fault detection; however, it will be appreciated that other commercially available fault detection software could also be used without departing from the spirit and scope of the present invention.

The fault detection and analysis unit 122, in one embodiment, performs control functions based upon the results determined by the fault detection module 125. Upon analyzing the determined results, the fault detection and analysis unit 122 attempts to rectify any fault conditions with the processing tool 105. The solution to a fault condition may be for the fault detection and analysis unit 122 to send a control signal to the machine interface 310 of the APC framework 120 to shut down the processing tool 105 to prevent further manufacturing of faulty silicon wafers. The fault detection and analysis unit 122, in addition to shutting down the processing tool 105, may also apprise a "fab" technician of any potential solutions to rectify the fault condition through an operator interface (not shown), for example.

Figure 4:
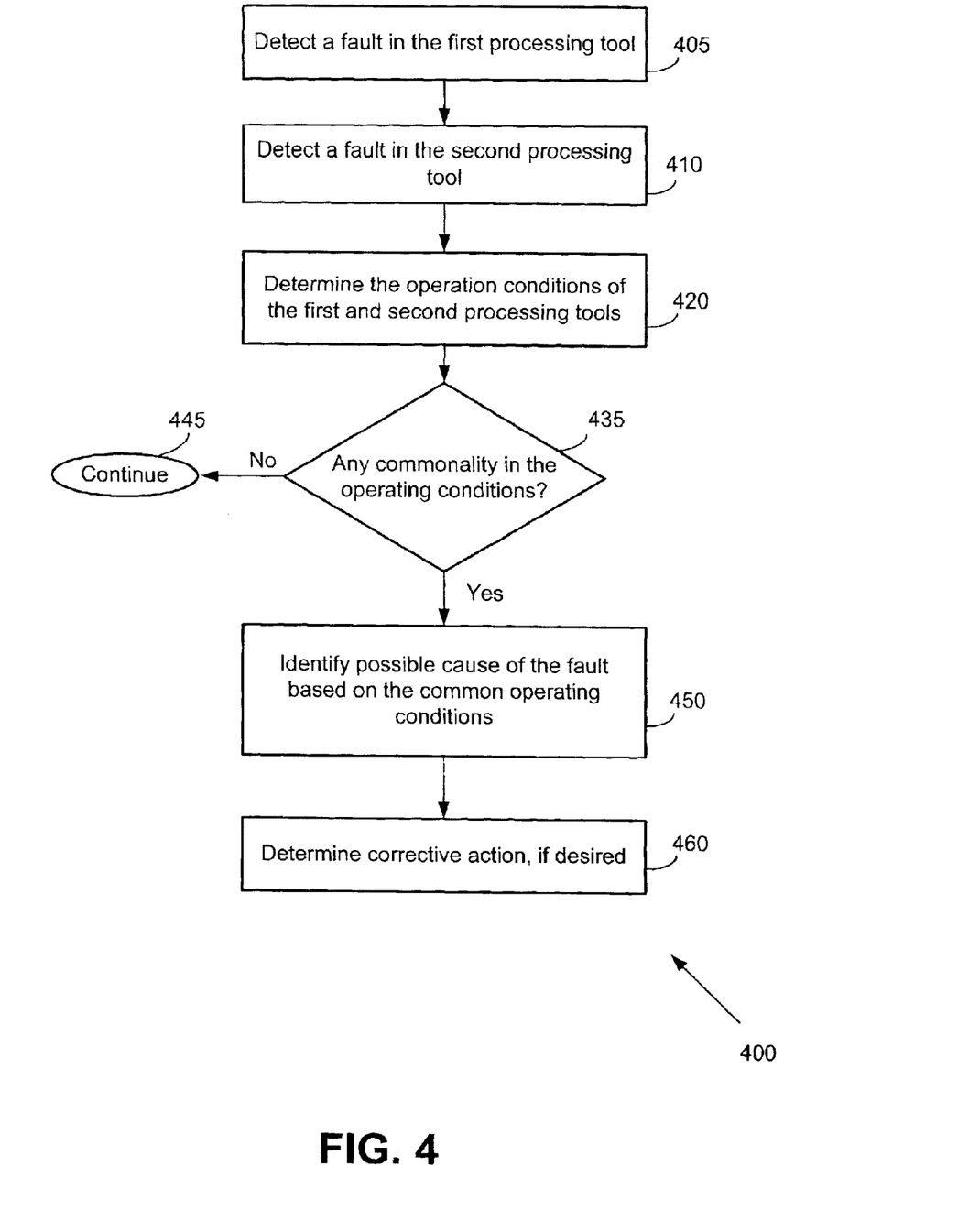
FIG. 4 depicts a process that may be implemented in the manufacturing system of FIG. 1, in accordance with one embodiment of the present invention.

Turning now to FIG. 4, a process 400 for determining a possible cause of faults in the APC framework 120 is provided. For ease of illustration, the process 400 of FIG. 4 is described in the context of determining a possible cause of faults occurring in two processing tools 105(1–2). However, it should be appreciated that the described process 400 is not limited as such, and may be applicable to determining a possible cause of faults occurring in any other desirable number of processing tools 105. Although not so limited, in one embodiment, the second processing tool 105(2) may be downstream relative to the first processing tool 105(1).

Figure 5A:
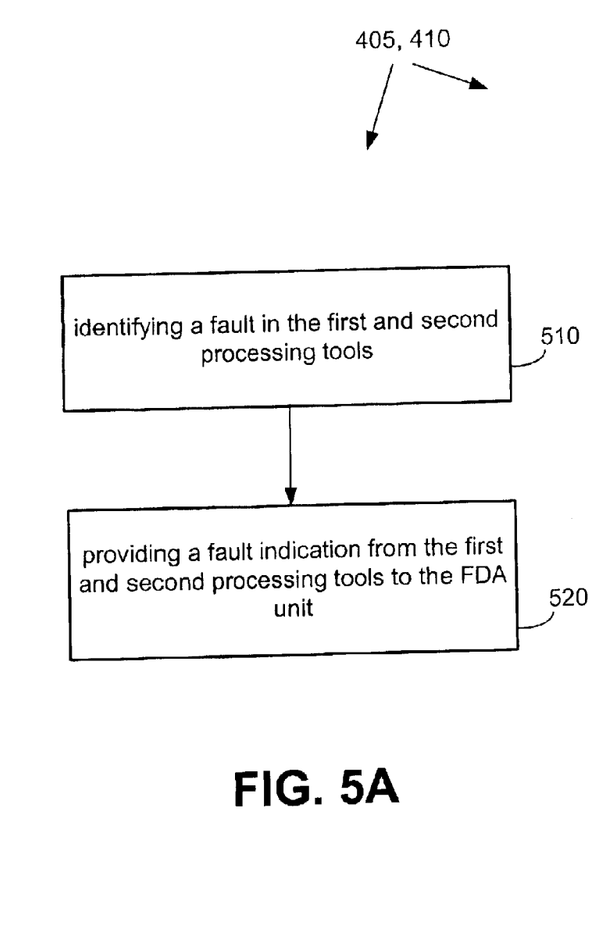
FIGS. 5A–5B illustrates an alternative embodiment of the process of FIG. 4.

The fault detection and analysis unit 122 (see FIG. 1) detects (at 405) a fault in the first processing tool 105(1) and detects (at 410) a fault in the second processing tool 105(2). The faults may be detected (at 405 and at 410) in one of a variety of ways, as shown in FIGS. 5A–B. In FIG. 5A, each fault is identified (at 510) by the respective processing tools 105(1–2), which then provide (at 520) a respective fault indication to the fault detection and analysis unit 122 (see FIG. 1). The fault indication, in one embodiment, may be a message identifying an undesirable event or a log of one or more undesirable events occurring in the processing tools 105(1–2). In one embodiment, the processing tools 105(1–2) may also provide at least an approximate time and date of the occurrence of the faults.

Figure 5B:
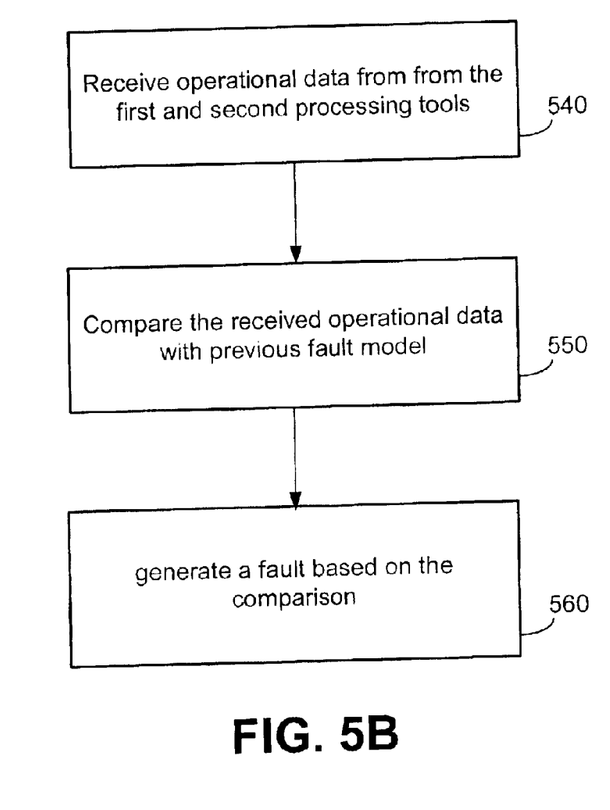

In an alternative embodiment, the faults may be detected by the fault detection and analysis unit 122, as illustrated in FIG. 5B. In FIG. 5B, the fault detection module 125 of the fault detection and analysis unit 122 receives (at 540) operational data from each of the first and second processing tools 105(1–2), compares (at 550) the received operational data with a previous fault model, and then generates (at 560) a fault based on the comparison. As mentioned, the fault model includes operational data from other similar-type tools in which it was previously known that such processing tools 105(1–2) manufactured silicon wafers within acceptable operational limits. In one embodiment, the fault detection and analysis unit 122 may determine, based on the date and time stamp information provided as part of the operational data, when the faults may have occurred in the processing tools 105(1–2).

Referring again to FIG. 4, the fault detection and analysis unit 122 determines (at 420) the operating conditions of the first and second processing tools 105(1–2). As mentioned, the "operating conditions" of the processing tools 105(1–2) may, in part, include the configuration of the processing tools 105(1–2) when in operation and/or the ambient conditions associated with the processing tools 105(1–2) when in operation. Accordingly, in one embodiment, determining (at 420) the operating conditions may include accessing the configuration information associated with the processing tools 105(1–2). The configuration information, in one embodiment, may be stored in, and hence be accessed from, the configuration profiles 135 (see FIG. 1) of the fault detection and analysis unit 122. Alternatively, the configuration information may be received from the processing tools 105. In yet another embodiment, some portions of the configuration information may be stored in the fault detection and analysis unit 122, while other portions of the configuration information may be received from the processing tools 105. In one embodiment, determining (at 420) the operating conditions may include accessing environmental data proximate to each processing tool 105(1–2), the physical location of each processing tool 105(1–2), and/or any other desirable configuration information associated with the processing tools 105(1–2).

The fault detection and analysis unit 122 determines (at 435) if any common commonality exists in the operating conditions between the first between the first and second processing tools 105(1–2) based on the determined operating conditions. Detecting a fault in the first processing tool 105(1) and the second processing tool 105(2), coupled with the fact that a common operating condition may exist between the first and second processing tools 105(1–2) may indicate that the detected faults may have a common cause. It should be noted, however, that even though the faults may have been caused by a common cause, the faults produced by the processing tools 105(1–2) may be of different types. For example, the first processing tool 105(1) may generate a fault indicative of an overheated chamber, while the second processing tool 105(2) may generate a load lock fault. The type of fault generated by the processing tools 105(1–2) may, in part, depend on the position of the semiconductor device inside the processing tools 105(1–2) at the time the faults occur. Nevertheless, in accordance with one embodiment of the present invention, the commonality in the operating conditions of the processing tools 105(1–2) may be cross-correlated to identify one or more possible sources of the detected faults. Additionally, in one embodiment, if the detected faults are close in proximity (in terms of time and/or location) to each other, the likelihood that the two faults were caused by a common source may also increase.

If it is determined (at 435) that no commonality exists in the operating conditions of the processing tools 105(1–2), then the fault detection and analysis unit 122, in one embodiment, continues (at 445) with normal operations, which may include performing additional analysis to determine if each of the faults detected (at 405 and at 410) in the processing tools 105(1–2) may have been caused by unrelated events.

Figure 6:
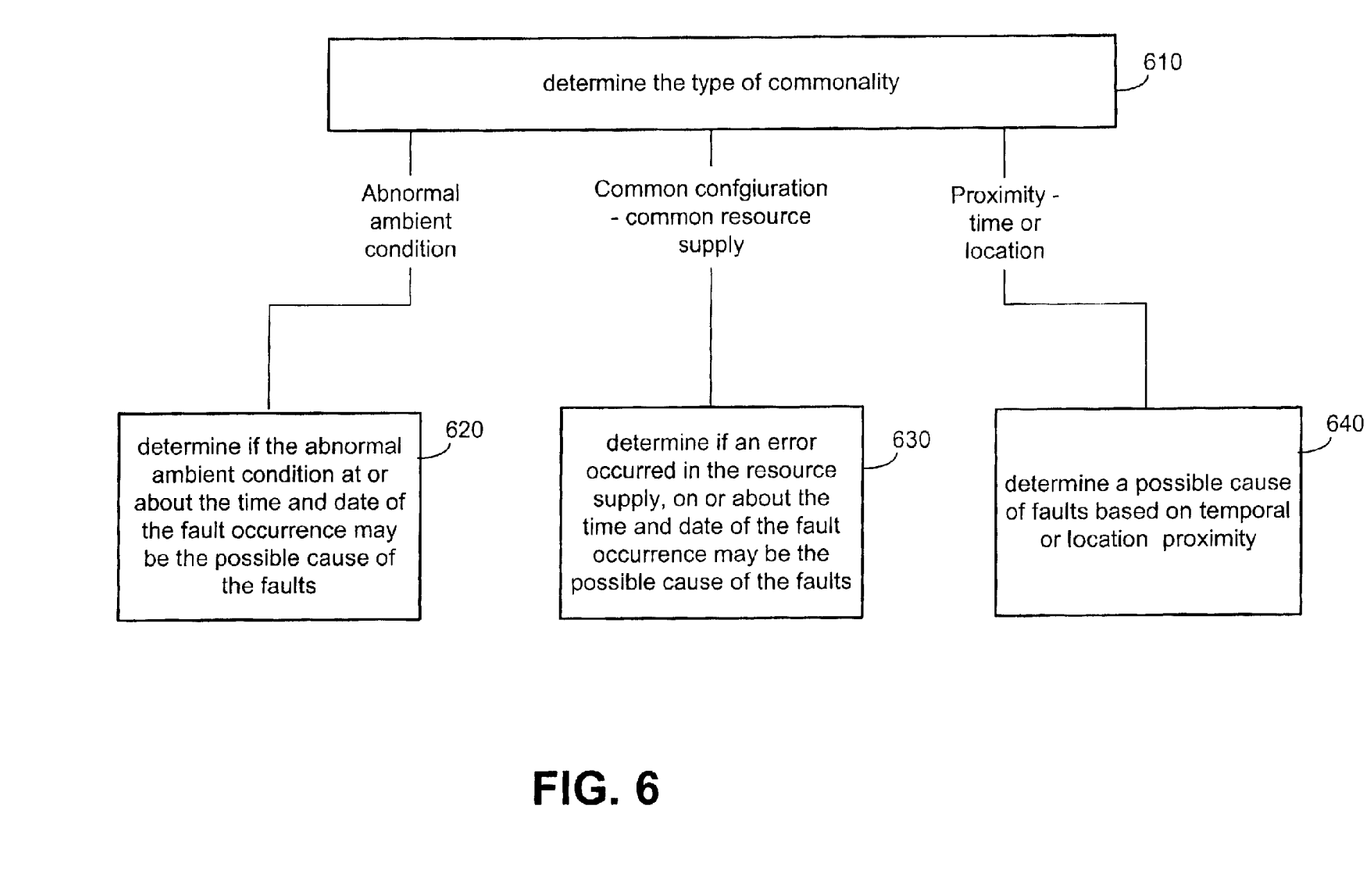
FIG. 6 shows an alternative embodiment process of FIG. 4, in accordance with the present invention.

If it is determined (at 435) that one or more common operating conditions exist between the first and second processing tools 105, then the FDA 122 identifies (at 450) a possible source/cause of the fault based on the common operating conditions. FIG. 6 illustrates an exemplary act of identifying (at 450) a possible cause of the fault. In FIG. 6, the fault detection and analysis unit 122 determines (at 610) the common operating conditions between the first and second processing tools 105(1–2). The common operating conditions, in one embodiment, may be in the form of an abnormal ambient condition (e.g., high humidity levels) under which both the processing tools 105(1–2) were operating on or about the time the faults occurred. Alternatively, the common operating conditions may be in the form of resource supplies provided to the processing tools (1–2) from common facilities 106 (see FIG. 1). For instance, in the exemplary configuration profiles 135(1–2) of FIG. 2, the only common configuration element that is shared by the first and second processing tools 105(1–2) is the power connection from facility "C," as indicated in elements 137(3) and 139(3).

Referring again to FIG. 6, if the common operating condition between the two processing tools 105(1–2) is at least one abnormal ambient condition, then the fault detection and analysis unit 122 determines (at 620) if that abnormal ambient condition at or about the time and date of the fault occurrence may have been the possible cause of the faults detected in the processing tools 105(1–2). For example, a sudden change in weather conditions may give rise to a humidity problem in the room or bay in which the processing tools 105(1–2) are located, and, as such, the processing tools 105(1–2) may each produce a fault because of the changed ambient conditions.

If the fault detection and analysis unit 122 determines (at 610) that one or more of the common operating conditions between the first and second processing tools 105(1–2) are connections to common resource supply facilities 106, then the fault detection and analysis unit 122 determines (at 630) if any errors (e.g., malfunctions or interruptions) occurred during the supply of such resources on or about the time and date of the respective faults were detected (at 405 and at 410). For example, with reference to the exemplary configuration profiles 135(1–2) of FIG. 2, since one common configuration element between the two processing tools 105(1–2) is the power connection from facility "D," it may be useful to determine if any problems occurred with the delivery of the power supply on or about the time the faults occurred in the processing tools 105(1–2). An occurrence of an RF arc in the power supplied form facility "D" on or about the time of the faults, for instance, may be a possible cause of the faults detected (at 405, 410) in the processing tools 105(1–2).

In one embodiment, the logs or records of the resource supply facilities 106 may be manually checked to determine if any problems occurred with the supply of resources at the time and date of interest that may have caused the faults. In an alternative embodiment, the fault detection and analysis unit 122 may be adapted to access electronic records of the facilities 106 to check for undesirable interruptions or malfunctions in the supply of the resources during the relevant time period. In yet another embodiment, log files of the processing tools 105(1–2) may also be used to determine if any errors with resource supplies were detected.

If the fault detection and analysis unit 122 determines (at 610) that the commonality between the first and second processing tools 105(1–2) is based on the location or the time of occurrence of the faults, then the fault detection and analysis unit 122, in one embodiment, determines (at 640) if the faults may have been caused by a common source. For example, if the two faults occur in the processing tools 105(1–2) within a preselected time of each other, the fault detection and analysis unit 122, in one embodiment, determines if a common configuration element or undesirable ambient condition between the processing tools 105(1–2 may have been a possible source or cause of the faults. The preselected time, in one embodiment, may be any time interval that indicates that both of the faults occurred in close proximity to each other, such as within a few minutes or seconds of each other. It should, however, be appreciated that the "preselected time" may vary from one implementation to another, depending on a variety of factors, such as the efficiency of the fault detection module 125 (see FIG. 1), the operating speed of the control units 121, 122, and the like.

If the fault generating processing tools 105(1–2) are located in close proximity to each other, then, the fault detection and analysis unit 122, in one embodiment, may determine (at 640) if the faults were caused by a common event, such as an error in a resource supply to the tools 105(1–2) or an undesirable ambient condition proximate the tools 105(1–2). In one embodiment, the geographical proximity of the processing tools 105 (1–2) may be taken into account because the likelihood of a common source causing such faults in multiple processing tools 105(1–2) may increase when each processing tool 105(1–2) located in a relatively small geographical region produces a fault.

In instances where more than one common operating condition exists between the processing tools 105(1–2) or among a plurality of processing tools 105, each of the common operating condition may be analyzed to determine if that condition may have been the cause of the faults.

Referring again to FIG. 4, the fault detection and analysis unit 122 determines (at 460) a corrective action, if desired, to cure the fault condition of the processing tools 105(1–2). The corrective action may include sending a control signal to the equipment interface 110 (1–2) to shut down the processing tools 105(1–2), and/or to provide instructions to a "fab" technician on how to cure the fault, for example. The process in which the fault detection module 125 determines how to cure the fault condition is well within the knowledge of one of ordinary skill in the art. Accordingly, such process will not be discussed herein to avoid unnecessarily obscuring the present invention.

In accordance with one or more embodiments of the present invention, a method and apparatus are provided for determining a probable fault in a plurality of processing tools 105. One example of determining a possible cause comprises identifying a common configuration among a plurality of processing tools 105. The common configuration may be a cause of the faults that are generated in the plurality of processing tools 105. The common cause, for example, may be an error in the delivery of supply resources that are provided to all of the processing tools 105. In such a scenario, the faults that occur in the plurality of processing tools 105 may oftentimes be in relative proximity (in terms of time and/or geographical location) to each other. Accordingly, in one embodiment of the present invention, it may also be possible to determine a possible cause of two or more faults in the processing tools 105 based on the (geographical or temporal) proximity of the faults relative to each other.

The various system layers, routines, or modules may be executable by the control units 121, 123 (see FIG. 1). As utilized herein, the term "control unit" may include a microprocessor, a microcontroller, a digital signal processor, a processor card (including one or more microprocessors or controllers), or other control or computing devices. The storage units 124 (see FIG. 1) referred to in this discussion may include one or more machine-readable storage media for storing data and instructions. The storage media may include different forms of memory including semiconductor memory devices such as dynamic or static random access memories (DRAMs or SRAMs), erasable and programmable read-only memories (EPROMs), electrically erasable and programmable read-only memories (EEPROMs) and flash memories; magnetic disks such as fixed, floppy, removable disks; other magnetic media including tape; and optical media such as compact disks (CDs) or digital video disks (DVDs). Instructions that make up the various software layers, routines, or modules in the various systems may be stored in respective storage devices. The instructions when executed by a respective control unit cause the corresponding system to perform programmed acts.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   determining a first fault in a first processing tool executing under first operating conditions;
   determining a second fault in a second processing tool executing under second operating conditions; and
   identifying a possible source of the second fault based on at least the first operating conditions of the first processing tool.

2. The method of claim 1, further identifying the possible source of the second fault based on a comparison of at least one of the first operating conditions of the first processing tool and at least one of the second operating conditions of the second processing tool.

3. The method of claim 1, further comprising:
   receiving configuration information associated with the first processing tool; and
   receiving configuration information associated with the second processing tool.

4. The method of claim 3, wherein identifying the possible source of the second fault comprises comparing at least a portion of the configuration information associated with the first processing tool with at least a portion of the configuration information associated with the second processing tool and determining a common configuration element between the first and second processing tools.

5. The method of claim 1, further comprising determining a source of the second fault based on determining at least one of an error in common resource supply to the first and second processing tools and a common undesirable ambient condition proximate the first and second processing tools.

6. The method of claim 1, further comprising determining if the first and second faults occurred within a preselected time of each other.

7. The method of claim 1, wherein determining the second fault comprises:
   receiving operational data from the second processing tool related to the manufacture of a device; and
   comparing the received operational data with a previously established fault model data.

8. An apparatus, comprising:
   an interface; and
   a control unit communicatively coupled to the interface, the control unit adapted to:
      detect a first fault in a first processing tool;
      detect a second fault in a second processing tool; and
      determine a cause of the second fault based on detecting the first fault.

9. The apparatus of claim 8, wherein the interface is adapted to receive at least one of a fault indication and operational data from the first processing tool and the second processing tool.

10. The apparatus of claim 9, wherein the control unit is adapted to detect the first fault and the second fault based on the operational data received from the first and second processing tools.

11. The apparatus of claim 8, wherein the control unit is adapted to detect the first fault and the second fault based on configuration information stored in a fault detection and analysis system.

12. The apparatus of claim 8, wherein the control unit is adapted to determine that the cause of the first fault is an error in delivering a resource to the first processing tool.

13. The apparatus of claim 8, wherein the control unit is further adapted to perform a corrective action in response to determining the cause of the second fault.

14. The apparatus of claim 13, wherein the corrective action comprises notifying a system administrator of the determined cause of the second fault.

15. The apparatus of claim 8, wherein the control unit is further adapted to:
   receive operational data from the second processing tool; and
   compare the received operational data with fault model data.

16. The apparatus of claim 15, further comprising a sensor for sensing and providing the operational data to the interface.

17. An article comprising one or more machine-readable storage media containing instructions that when executed enable a processor to:
   determine that a fault condition exists in a first processing tool;
   determine that a fault condition exists in a second processing tool; and
   determine if the fault condition in the second processing tool has a common cause as the fault condition in the first processing tool.

18. The article of claim 17, wherein the instructions when executed enable the processor to determine a common configuration element between the first and second processing tools.

19. The article of claim 17, wherein the instructions when executed enable the processor to receive configuration information of the first and second processing tools.

20. The article of claim 17, wherein the instructions when executed enable the processor to determine that the common cause is at least one of a faulty resource supply or undesirable ambient condition common to the first and second processing tools.

21. The article of claim 17, wherein the instructions when executed enable the processor to perform a corrective action in response to determining that the fault condition in the second processing tool has a common cause as the fault condition in the first processing tool.

22. The article of claim 21, wherein the instructions when executed enable the processor to notify a system administrator in response to determining that the fault condition in the second processing tool has a common cause as the fault condition in the first processing tool.

23. The article of claim 17, wherein the instructions when executed enable the processor to:
   receive operational data from the second processing tool related to the manufacture of a processing device; and compare the received operational data with a fault model data.

24. A system, comprising:
a first processing tool adapted to process a semiconductor device;
a second processing tool adapted to process the semiconductor device; and
a fault detection and analysis unit adapted to:
  determine that a fault condition is present in the first and second processing tools; and
  determine if the first and second processing tools have at least one common configuration element in response to determining that the fault condition is present in the first and second processing tools.

25. The system of claim 24, wherein the common configuration element is a resource supply provided to the first and second processing tools.

26. The system of claim 24, further comprising a framework adapted to communicatively couple the first and second processing tools to the fault detection and analysis unit.

27. The system of claim 24, wherein the fault detection and analysis unit is further adapted to perform a corrective action in response to determining the cause of the second fault.

28. The system of claim 24, further comprising a storage unit to store configuration information of the first and second processing tools and wherein the fault detection and analysis unit determines that the common cause is due to a configuration element common to the first and second processing tools.

29. The system of claim 24, further comprising at least one sensor for sensing and providing operational data of the first and second processing tools to the fault detection and analysis unit.

30. The system of claim 24, wherein the fault detection and analysis unit is further adapted to:
  receive the operational data; and
  compare the received operational data with a fault model data for each of the first and second processing tools.

31. The system of claim 24, wherein the fault detection and analysis unit determines that the common cause is an undesirable ambient condition that was common to the first and second processing tools on or about the times the fault conditions occurred.

32. An apparatus, comprising:
an interface; and
a control unit communicatively coupled to the interface, the control unit adapted to:
  detect a fault in a first processing tool; and
  determine that the detected fault is due to an error in delivering a resource supply to a second processing tool.

33. The apparatus of claim 32, wherein the control unit determines that the first processing tool also receives the resource supply.

34. An apparatus, comprising:
an interface; and
a control unit communicatively coupled to the interface, the control unit adapted to:
  detect a fault in a first processing tool, wherein the fault occurs at a first time at a first location;
  detect a fault in a second processing tool, wherein the fault in the second processing tool occurs at a second time at a second location; and
  determine a possible cause of the faults in the first and second processing tools based on the proximity of the first and second times or the proximity of the first and second locations.

35. The apparatus of claim 34, wherein the control unit determines the possible cause based on at least one common configuration between the first and second processing tools.

36. The apparatus of claim 34, wherein the second processing tool is downstream relative to the first processing tool.

37. The apparatus of claim 34, wherein the fault in the first processing tool occurs at substantially the same time as the fault in the second processing tool.

* * * * *